United States Patent
Reddy et al.

(10) Patent No.: US 12,489,400 B2
(45) Date of Patent: Dec. 2, 2025

(54) BAW RESONATOR BASED OSCILLATOR

(71) Applicant: Texas Instruments Incorporated, Dallas, TX (US)

(72) Inventors: Ajay Kumar Reddy, Srikakulam (IN); Arpan Thakkar, Bangalore (IN); Peeyoosh Mirajkar, Bangalore (IN); Bichoy Bahr, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/399,974

(22) Filed: Dec. 29, 2023

(65) Prior Publication Data
US 2025/0088148 A1    Mar. 13, 2025

Related U.S. Application Data

(60) Provisional application No. 63/538,125, filed on Sep. 13, 2023.

(51) Int. Cl.
  *H03B 5/36*    (2006.01)
  *H03K 5/00*    (2006.01)

(52) U.S. Cl.
  CPC ......... *H03B 5/364* (2013.01); *H03K 5/00006* (2013.01)

(58) Field of Classification Search
  CPC ... H03B 5/30; H03B 5/32; H03B 5/36; H03B 5/364
  See application file for complete search history.

(56) References Cited

U.S. PATENT DOCUMENTS

| | | | |
|---|---|---|---|
| 6,956,443 B2* | 10/2005 | Ruffieux | H03L 5/00 331/107 A |
| 9,515,605 B1 | 12/2016 | Madala et al. | |
| 9,531,323 B1* | 12/2016 | Khalili | H03B 5/1212 |
| 9,543,891 B2 | 1/2017 | Ryu et al. | |
| 9,553,545 B1* | 1/2017 | Khalili | H03B 5/364 |
| 2003/0025566 A1 | 2/2003 | Rogers | |
| 2008/0252390 A1* | 10/2008 | Guerreiro | H03B 5/32 331/158 |
| 2017/0033739 A1 | 2/2017 | Djahanshahi et al. | |

OTHER PUBLICATIONS

International Search Report in corresponding PCT Application No. PCT/2024/046416, mailed Jan. 9, 2025.

* cited by examiner

*Primary Examiner* — Jeffrey M Shin
(74) *Attorney, Agent, or Firm* — Mandy Barsilai Fernandez; Frank D. Cimino (57) ABSTRACT

A circuit includes a resonator, a transistor pair, and a common-mode feedback circuit. The transistor pair is cross-coupled across the resonator. The common-mode feedback circuit is coupled to the transistor pair. The common-mode feedback circuit includes first and second degeneration cells. The second degeneration cell is connected in parallel with the first degeneration cell. The second degeneration cell is configured to switchably vary a current flow through the transistor pair.

13 Claims, 9 Drawing Sheets

BAW RESONATOR BASED OSCILLATOR

CROSS-REFERENCE TO RELATED APPLICATIONS

This application claims priority to U.S. Provisional Application No. 63/538,125 filed Sep. 13, 2023, entitled "Prevention of Parasitic Oscillations in BAW Resonator Based Oscillators," which is hereby incorporated by reference.

BACKGROUND

A resonator is a device or system that naturally oscillates at a frequency called a resonant frequency. Resonators can be, for example, crystal resonators (also known as quartz resonators), inductance-capacitance (LC) resonators, or microelectromechanical system (MEMS) resonators. Resonators are generally passive devices that are combined with active circuitry to create an oscillator. The oscillator produces a periodic signal at the resonant frequency. A crystal oscillator, for example, is an electronic circuit that uses the mechanical resonance of a vibrating crystal to create an electrical signal with a very precise frequency. Crystal oscillators may be used to generate frequencies to keep track of tine or to generate a clock signal for digital integrated circuits. MEMS resonators may be used in place of crystal resonators to keep track of time and to generate a stable clock signal for analog and digital integrated circuits.

SUMMARY

In one example, a circuit includes a resonator, first, second, third, fourth, fifth, and sixth transistors, first, second, third and fourth resistors, and first and second switches. The resonator has first and second terminals. The first transistor has a first terminal, a second terminal, and a control terminal. The first terminal of the first transistor is coupled to the first terminal of the resonator. The control terminal is coupled to the second terminal of the resonator. The second transistor has a first terminal, a second terminal, and a control terminal. The first terminal of the second transistor is coupled to the second terminal of the resonator. The control terminal of the second transistor is coupled to the first terminal of the resonator. The third transistor has a first terminal, a second terminal, and a control terminal. The first terminal of the third transistor is coupled to the second terminal of the first transistor. The control terminal of the third transistor is coupled to the first terminal of the resonator. The first resistor is coupled between the second terminal of the third transistor and a reference voltage terminal. The fourth transistor has a first terminal, a second terminal, and a control terminal. The first terminal of the fourth transistor is coupled to the second terminal of the first transistor. The control terminal of the fourth transistor is coupled to the first terminal of the resonator. The second resistor and the first switch are coupled in series between the second terminal of the fourth transistor and the reference voltage terminal. The fifth transistor has a first terminal, a second terminal, and a control terminal. The first terminal of the fifth transistor is coupled to the second terminal of the second transistor. The control terminal of the fifth transistor is coupled to the second terminal of the resonator. The third resistor is coupled between the second terminal of the fifth transistor and the reference voltage terminal. The sixth transistor includes a first terminal, a second terminal, and a control terminal. The first terminal of the sixth transistor is coupled to the second terminal of the second transistor. The control terminal of the sixth transistor is coupled to the second terminal of the resonator. The fourth resistor and the second switch are coupled in series between the second terminal of the sixth transistor and the reference voltage terminal.

In another example, a circuit includes a resonator, a transistor pair, and a common-mode feedback circuit. The transistor pair is cross-coupled across the resonator. The common-mode feedback circuit is coupled to the transistor pair. The common-mode feedback circuit includes first and second degeneration cells. The second degeneration cell is connected in parallel with the first degeneration cell. The second degeneration cell is configured to switchably vary a current flow through the transistor pair.

In a further example, a clock generator circuit includes an oscillator circuit, a frequency divider circuit, and a driver circuit. The frequency divider circuit is coupled to the oscillator circuit. The driver circuit coupled to the frequency divider circuit. The oscillator circuit includes a resonator, a transistor pair, and a common-mode feedback circuit. The transistor pair is cross-coupled across the resonator. The common-mode feedback circuit is coupled to the transistor pair. The common-mode feedback circuit includes first and second degeneration cells. The second degeneration cell connected in parallel with the first degeneration cell. The second degeneration cell is configured to switchably vary a current flow through the transistor pair.

BRIEF DESCRIPTION OF THE DRAWINGS

FIG. 4 is a graph showing an example of small signal gain for different currents of the oscillator circuit of FIG. 3.

FIG. 6 is a graph showing example small signal gain and corresponding large signal gain of the oscillator circuit of FIG. 3.

DETAILED DESCRIPTION

Oscillator circuits, including resonators such as bulk acoustic wave (BAW) resonators, can oscillate at frequencies other than the desired fundamental frequency of the resonator. In some cases, the oscillator circuit may oscillate at a parasitic frequency that is higher or lower than the fundamental frequency of the resonator. Some oscillator circuits may include inductor-capacitor filters to prevent parasitic oscillation, which can consume substantial circuit area. Alternatively, devices that exhibit parasitic oscillation may be discarded, which reduces yield.

Rather than using passive filters including large inductors and capacitors to reduce gain at the parasitic frequencies, the oscillator circuits described herein may include a linearized common-mode feedback loop and/or ramping of current in the oscillator circuit to eliminate parasitic oscillation. Some examples may include resistors in series with the control terminals of the oscillator's transistors to reduce gain at frequencies above the resonator fundamental frequency to eliminate parasitic oscillation at frequencies higher than the fundamental frequency.

Figure 1:
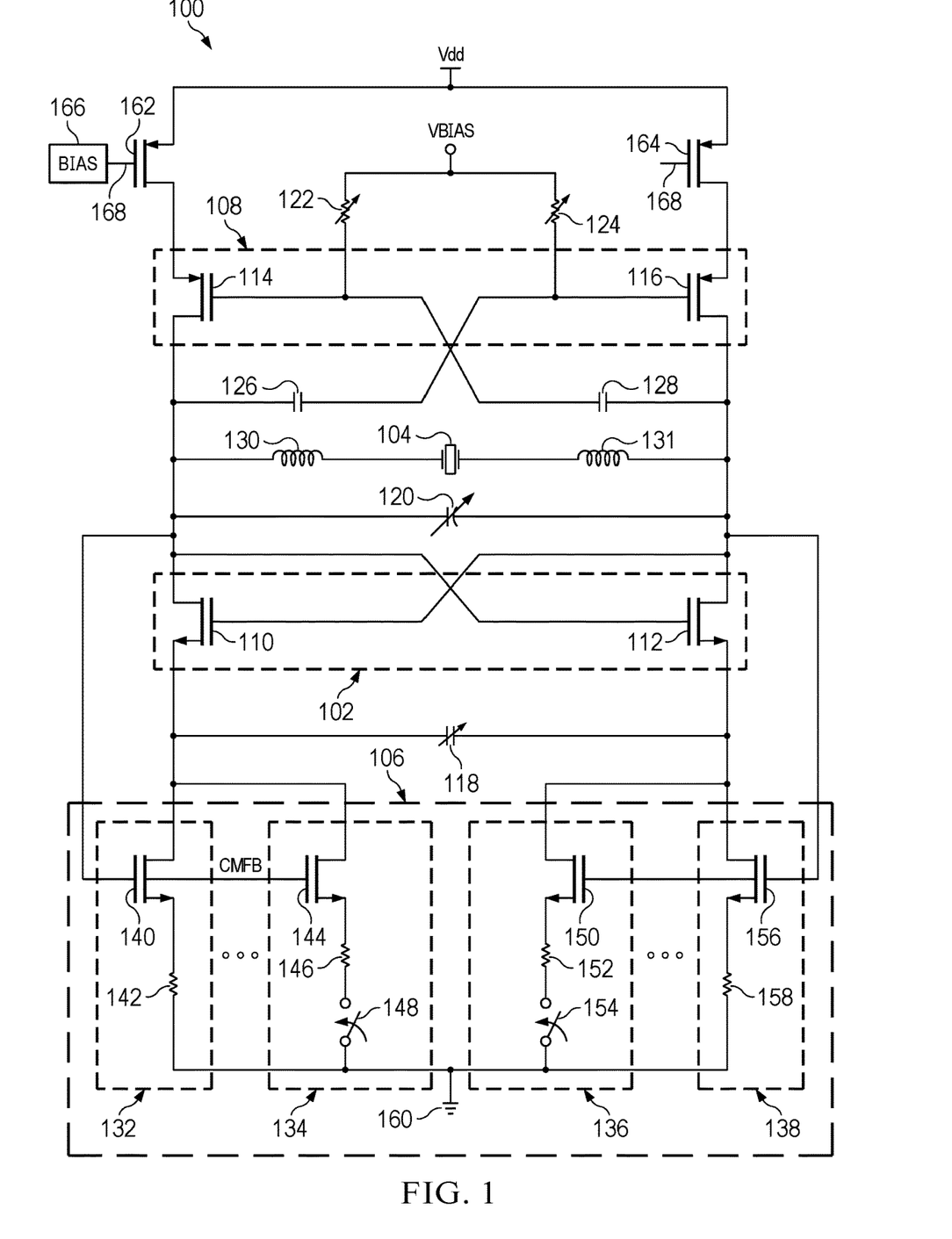
FIG. 1 is a schematic diagram of an example oscillator circuit that includes a bulk acoustic wave (BAW) resonator and variable common-mode feedback.

FIG. 1 is a schematic diagram of an example oscillator circuit 100. The oscillator circuit 100 includes a transistor pair 102 and a resonator 104, a common-mode feedback circuit 106, a transistor pair 108, capacitors 118, 120, 126, and 128, resistors 122 and 124, and transistors 162 and 164. The resonator 104 may be a BAW resonator or another type of resonator. An inductor 130 and/or an inductor 131 may be coupled in series with the resonator 104 between terminals of the transistor pair 102 and terminals of the transistor pair 108. The inductors 130 and 131 may be components or parasitic. The capacitor 120 is coupled in parallel with the resonator 104 between terminals of the transistor pair 102 and terminals of the transistor pair 108. The capacitance of the capacitor 120 may be variable to provide for adjustment of the oscillation frequency of the oscillator circuit 100.

The transistor pair 102 includes transistors 110 and 112. The transistors 110 and 112 may be n-type field effect transistors (NFETs), as shown. The transistors 110 and 112 are cross-coupled across the resonator 104. As such, a first current terminal, or simply terminal, (e.g., drain) of the transistor 110 is coupled to a first terminal of the resonator 104, and a control terminal (e.g., gate) of the transistor 110 is coupled to a second terminal of the resonator 104. Also, in the cross-coupled configuration, a first current terminal (e.g., drain) of the transistor 112 is coupled to the second terminal of the resonator 104, and a control terminal (e.g., gate) of the transistor 112 is coupled to the first terminal of the resonator 104. A second current terminal (e.g., source) of the transistor 110 is coupled to the common-mode feedback circuit 106 and to a first conductor (also referred to as a terminal) of the capacitor 118. A second current terminal (e.g., source) of the transistor 112 is coupled to the common-mode feedback circuit 106 and to a second conductor (also referred to as a terminal) of the capacitor 118. The capacitor 118 provides control of the gain contribution of the transistor pair 102 at low frequencies. The capacitor 118 may be variable to allow adjustment for process variation in the capacitance.

The transistor pair 108 includes transistors 114 and 116. The transistors 114 and 116 may be p-type field effect transistors (PFETs), as shown. The transistors 114 and 116 are cross-coupled across the resonator 104. As such, a first current terminal (e.g., drain) of the transistor 114 is coupled to the first terminal of the resonator 104, and a control terminal (e.g., gate) of the transistor 114 is coupled to the second terminal of the resonator 104 via the capacitor 128. Also, in the cross-coupled configuration, a first current terminal (e.g., drain) of the transistor 116 is coupled to the second terminal of the resonator 104, and a control terminal (e.g., gate) of the transistor 116 is coupled to the first terminal of the resonator 104 via the capacitor 126. A second current terminal (e.g., source) of the transistor 114 is coupled to a current source, in this example the transistor 162. A second current terminal (e.g., source) of the transistor 116 is coupled to a current source, in this example the transistor 164. The resistor 122 is coupled between the control terminal of the transistor 114 and a bias voltage circuit (not shown), at a bias voltage terminal VBIAS. The bias voltage provided at VBIAS may be in a range of 0.5-0.7 volts in some examples of the oscillator circuit 100. The resistor 124 is coupled between the control terminal of the transistor 116 and the bias voltage circuit, at the bias voltage terminal VBIAS. The resistors 122 and the capacitor 128 form a first high-pass filter, and the resistor 124 and the capacitor 126 form a second high-pass filter to control the gain of the transistor pair 108 at low frequencies. The resistances of the resistors 122 and 124 may be variable to provide control of the filter cut-off frequencies with process variation.

The transistors 162 and 164 provide current to the oscillator circuit 100. A first current terminal (e.g., source) of the transistor 162 is coupled to a power terminal Vdd, and a second current terminal (e.g., drain) of the transistor 162 is coupled to the second current terminal of the transistor 114. A control terminal (e.g., gate) of the transistor 162 is coupled to a bias circuit 166. The bias circuit 166 provide a bias voltage 168 to the transistors 162 and 164. The transistor 164 is coupled in parallel with the transistor 162. More particularly, a first current terminal (e.g., source) of the transistor 164 is coupled to the first current terminal of the transistor 162 and to the power terminal Vdd. A second current terminal (e.g., drain) of the transistor 164 is coupled to the second current terminal of the transistor 116. A control terminal (e.g., gate) of the transistor 164 is coupled to the bias circuit 166 to receive the bias voltage 168. The bias voltage 168 may be in a range of 0.5-0.7 volts in some examples of the bias circuit 166. The transistors 162 and 164 may be PFETs, as shown.

The common-mode feedback circuit 106 includes degeneration cells 132, 134, 136, and 138. The degeneration cell 132 and the degeneration cell 134 are coupled to the transistor 110. The degeneration cell 136 and the degeneration cell 138 are coupled to the transistor 112. The degeneration cell 132 and the degeneration cell 138 are coupled to a reference voltage terminal 160 (e.g., ground) by fixed conductors. The degeneration cell 134 and the degeneration cell 136 are switchably coupled to the reference voltage terminal 160 by switches. Examples of the common-mode feedback circuit 106 may include more than one instance of the degeneration cell 134, and more than one instance of the degeneration cell 136. Each instance of the degeneration cell 134 and the degeneration cell 136 may be independently controlled. Accordingly, the resistance of the path between the transistor pair 102 and the reference voltage terminal 160 may be varied by controlling the number of degeneration cells conducting current to the reference voltage terminal 160.

The degeneration cell 132 includes a transistor 140 and a resistor 142. A first current terminal (e.g., drain) of the transistor 140 is coupled to the second current terminal of the transistor 110. The resistor 142 is coupled between a second current terminal (e.g., source) of the transistor 140 and the reference voltage terminal 160. A control terminal (e.g., gate) of the transistor 140 is coupled to the first terminal of the resonator 104.

The degeneration cell 134 includes a transistor 144, a resistor 146, and a switch 148. The switch 148 may include a field effect transistor or other switching device. A first current terminal (e.g., drain) of the transistor 144 is coupled to the first current terminal of the transistor 140. A control terminal (e.g., gate) of the transistor 144 is coupled to the control terminal of the transistor 140. The resistor 146 and the switch 148 are coupled in series between a second current terminal (e.g., source) of the transistor 144 and the reference voltage terminal 160.

The degeneration cell 138 includes a transistor 156 and a resistor 158. A first current terminal (e.g., drain) of the transistor 156 is coupled to the second current terminal of the transistor 112. The resistor 158 is coupled between a second current terminal (e.g., source) of the transistor 156 and the reference voltage terminal 160. A control terminal (e.g., gate) of the transistor 156 is coupled to the second terminal of the resonator 104.

The degeneration cell 136 includes a transistor 150, a resistor 152, and a switch 154. The switch 154 may include a field effect transistor or other switching device. A first current terminal (e.g., drain) of the transistor 150 is coupled to the first current terminal of the transistor 156. A control terminal (e.g., gate) of the transistor 150 is coupled to the control terminal of the transistor 156. The resistor 152 and the switch 154 are coupled in series between a second current terminal (e.g., source) of the transistor 150 and the reference voltage terminal 160.

Figure 2:
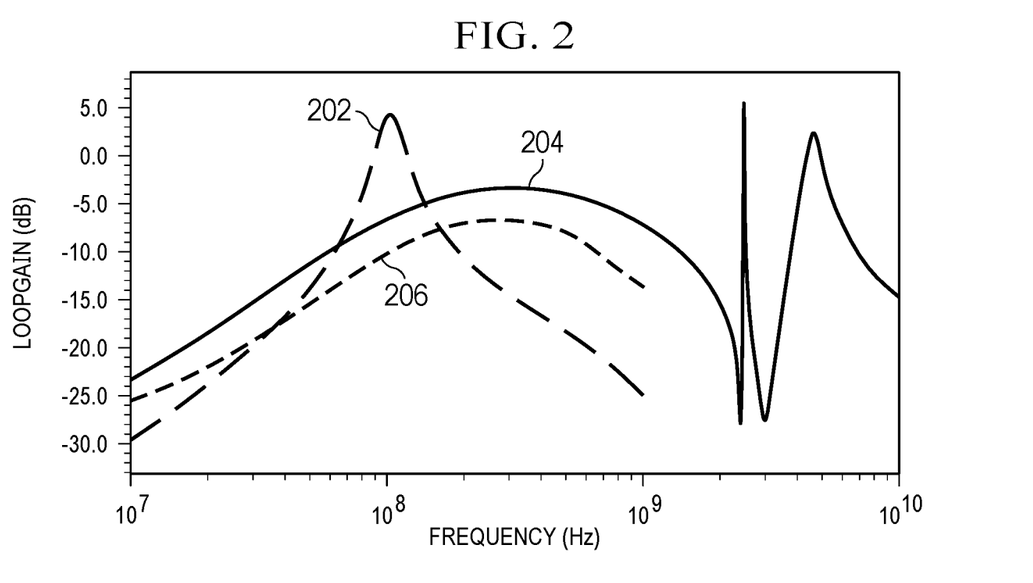
FIG. 2 is a graph showing example small signal loop gain and large signal loop gain in the oscillator circuit of FIG. 1.

FIG. 2 is a graph showing example small signal loop gain and large signal loop gain in the oscillator circuit 100. In FIG. 2, the curve 204 represents the small signal loop gain of the oscillator circuit 100. In FIG. 2, the curve 202 represents large signal loop gain in an oscillator circuit that lacks the variable degeneration of the common-mode feedback circuit 106. In such a circuit, the currents in the common mode feedback transistors may be modulated, which generates non-linear transconductance ($g_m$) components in the feedback loop causing an increase in large signal impedance at low frequency, which results in low frequency peaking above 0 dB as shown in the curve 202. The low frequency gain peak can result in low frequency oscillation in addition to, or in lieu of, oscillation at the fundamental frequency of the resonator.

The common-mode feedback circuit 106 provides resistive degeneration that prevents the low frequency peaking of the curve 202 from occurring by reducing the effect of the non-linear $g_m$ component of the transistors of the common-mode feedback circuit 106.

$$g_{m,eff} = \frac{g_m}{1 + g_m R_E}, \text{ for } g_m R_E > 1, g_{m,eff} = 1/R_E \quad (1)$$

where: $g_{m,eff}$ is the effective transconductance of the common-mode feedback circuit 106; $g_m$ is the transconductance of the transistors of the common-mode feedback circuit 106; and $R_E$ is the resistance of the parallel degeneration resistors of the common-mode feedback circuit 106.

Equation (1) shows that the effective transconductance ($g_{m,eff}$) of the common-mode feedback circuit 106 is a function of the resistance ($R_E$) of the degeneration resistors (resistors 142, 146, 152, and 158) of the common-mode feedback circuit 106 if $g_m R_E$ is greater than one. Accordingly, the $g_m$ of the common-mode feedback circuit 106 can be controlled by degeneration and the low frequency oscillation enabled by the curve 202 can be prevented. However, to maintain constant swing across process and voltage, the oscillator current needs to be varied which will vary $g_m$ significantly. This will change $g_m R_E$ as well. For low values of current, $g_m R_E \ll 1$ and $g_{m,eff} = g_m$, in which case the desired degeneration may not be obtained with a fixed degeneration. The oscillator circuit 100 addresses this issue by providing adjustment of the number of degeneration cells 134 and 136 enabled in the common-mode feedback circuit 106 (by closure of the switch 148 and switch 154) based on the current drawn by the oscillator circuit 100 to keep $g_m R_E$ constant (or nearly constant). For example, the number of degeneration cells to be activated may be selected at manufacture/test of the 100, and switches of the degeneration cells closed at manufacture, test, or operation time to set the desired degeneration.

In FIG. 2, the curve 206 represents the large signal loop gain of the oscillator circuit 100. The common-mode feedback circuit 106 holds the large signal loop gain below 0 dB at low frequencies to prevent the low frequency oscillation enabled by the curve 202.

Figure 3:
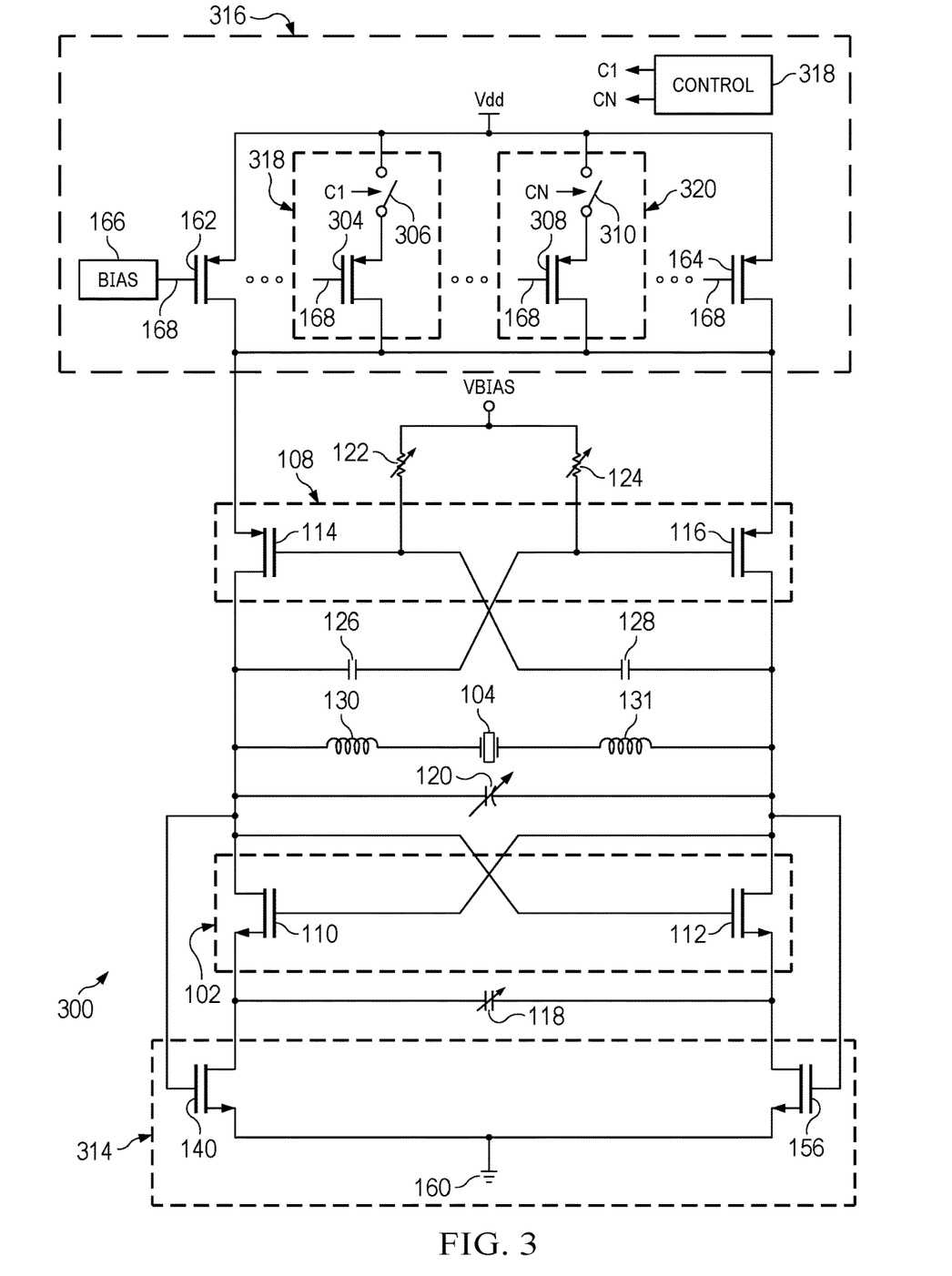
FIG. 3 is a schematic diagram of an example oscillator circuit that includes a BAW resonator and current ramping.

FIG. 3 is a schematic diagram of an example oscillator circuit 300. The oscillator circuit 300 is similar to the oscillator circuit 100. The oscillator circuit 300 includes the transistor pair 102, the resonator 104, the transistor pair 108, the capacitors 118, 120, 126, and 128, and the resistors 122 and 124. The oscillator circuit 300 includes a common-mode feedback circuit 314, which as shown includes only the transistors 140 and 156 having their second terminals coupled directly to the reference voltage terminal 160. In some examples of the oscillator circuit 300, the common-mode feedback circuit 106 may be used as the common-mode feedback circuit 314.

The oscillator circuit 300 also incorporates a current ramp circuit 316 that includes the transistors 162, 164, ramp cells 318 and 320, and a control circuit 318. The ramp cell 318 includes a transistor 304 and a switch 306. The ramp cell 320 includes a transistor 308 and a switch 310. The transistors 304, and 308 may be PFETs, as shown. Although FIG. 3 shows two ramp cells, the current ramp circuit 316 may include more than two ramp cells.

In the ramp cell 318, the transistor 304 and the switch 306 are coupled in series such that a first current terminal (e.g., source) of the transistor 304 is coupled to the first current terminals of the transistors 162 and 164 via the switch 306. Moreover, a second current terminal (e.g., drain) of the transistor 304 is coupled to the second current terminals of the transistors 162 and 164. A control terminal (e.g., gate) of the transistor 304 is coupled to the bias circuit 166 to receive the bias voltage 168. In the ramp cell 320, the transistor 308 and the switch 310 are coupled in series such that a first current terminal (e.g., source) of the transistor 308 is coupled to the first current terminals of the transistors 162 and 164 via the switch 310. Moreover, a second current terminal (e.g., drain) of the transistor 308 is coupled to the second current terminal of the transistor 162. A control terminal (e.g., gate) of the transistor 308 is coupled to the bias circuit 166 to receive the bias voltage 168.

The switch 306 and the switch 310 are coupled to the control circuit 318 (also referred to as a ramp control circuit) for receipt of control signals (Cl and CN) that control the opening and closing of the switch 306 and the switch 310. Examples of the current ramp circuit 316 may include more than two ramp cells coupled in parallel with the transistors 162 and 164 between Vdd and the transistor pair 108. At start-up of the oscillator circuit 300, the control circuit 318 may time the sequential closure of the switch 306 and the switch 310 (and any number of additional switches according to predetermined start-up timing function) to gradually increase the current flow in the oscillator circuit 300. In the oscillator circuit 300, oscillation can occur at frequencies where the loop gain is greater than 1. Loop gain is a function of transconductance, which is dependent on current flow. The current ramp circuit 316 provides reliable start up oscillation at the desired frequency (e.g., the fundamental frequency of the resonator 104) by gradually increasing the current flowing in the oscillator circuit 300 at start-up. The resonator 104 has high impedance at the fundamental frequency, which provides that gain in the oscillator circuit 300 is higher at the fundamental frequency than at higher or lower peaks. Accordingly, the gain at the fundamental frequency is the first to exceed 0 dB as the current ramp circuit 316 increases the current flowing in the oscillator circuit 300, which provides that oscillations start only at the fundamental frequency.

Figure 5:
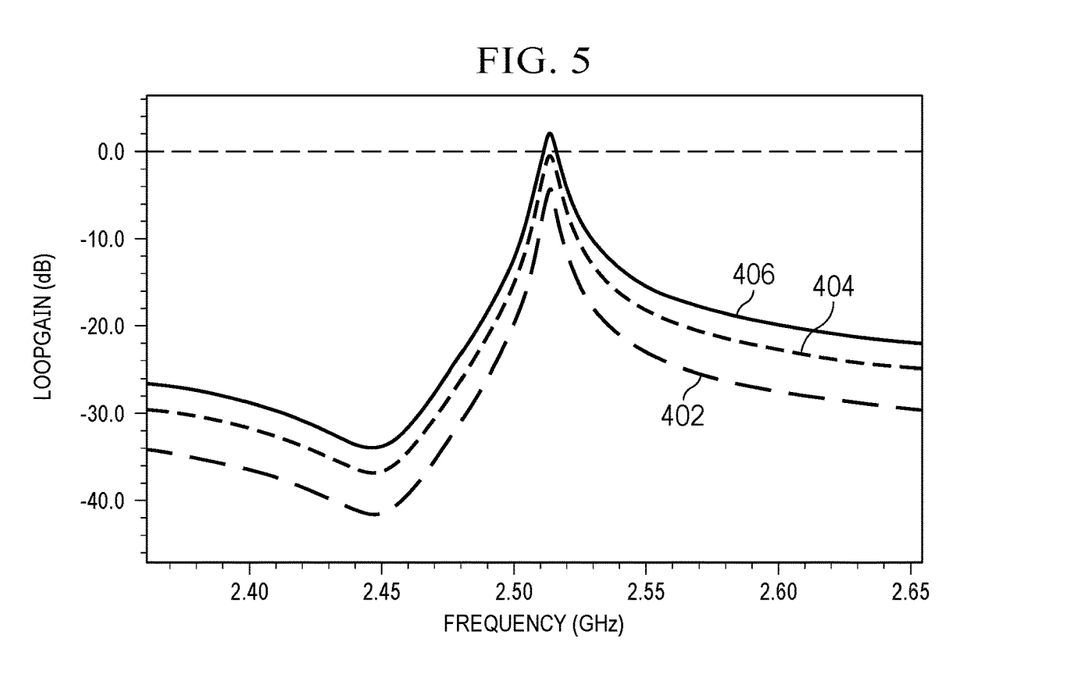
FIG. 5 is a graph showing a zoomed portion of the graph of FIG. 4

FIGS. 4 and 5 are graphs showing example small signal gain increasing in the oscillator circuit 300 as the current is increased at start-up (e.g., as the switch 310 is closed a predetermined time after the switch 306). FIG. 5 is a magnified view of the curves 402, 404, and 406 in the interval 408 of FIG. 4. The curve 402 represents gain in the oscillator circuit 300 at a first current. The curve 404 represents gain in the oscillator circuit 300 at a second current that is higher than the first current. The curve 406 represents gain in the oscillator circuit 300 at a third current that is higher than the second current. FIG. 5 shows that the small signal gain of the oscillator circuit 300 exceeds 0 dB only at the fundamental frequency of the resonator 104.

FIG. 6 is a graph showing example large signal loop gain 604 and small signal loop gain 602 in the oscillator circuit 300. Large signal gain remains below 0 dB for all frequencies lower than fundamental, so that that oscillation is stable at the fundamental frequency of the resonator 104.

Figure 7:
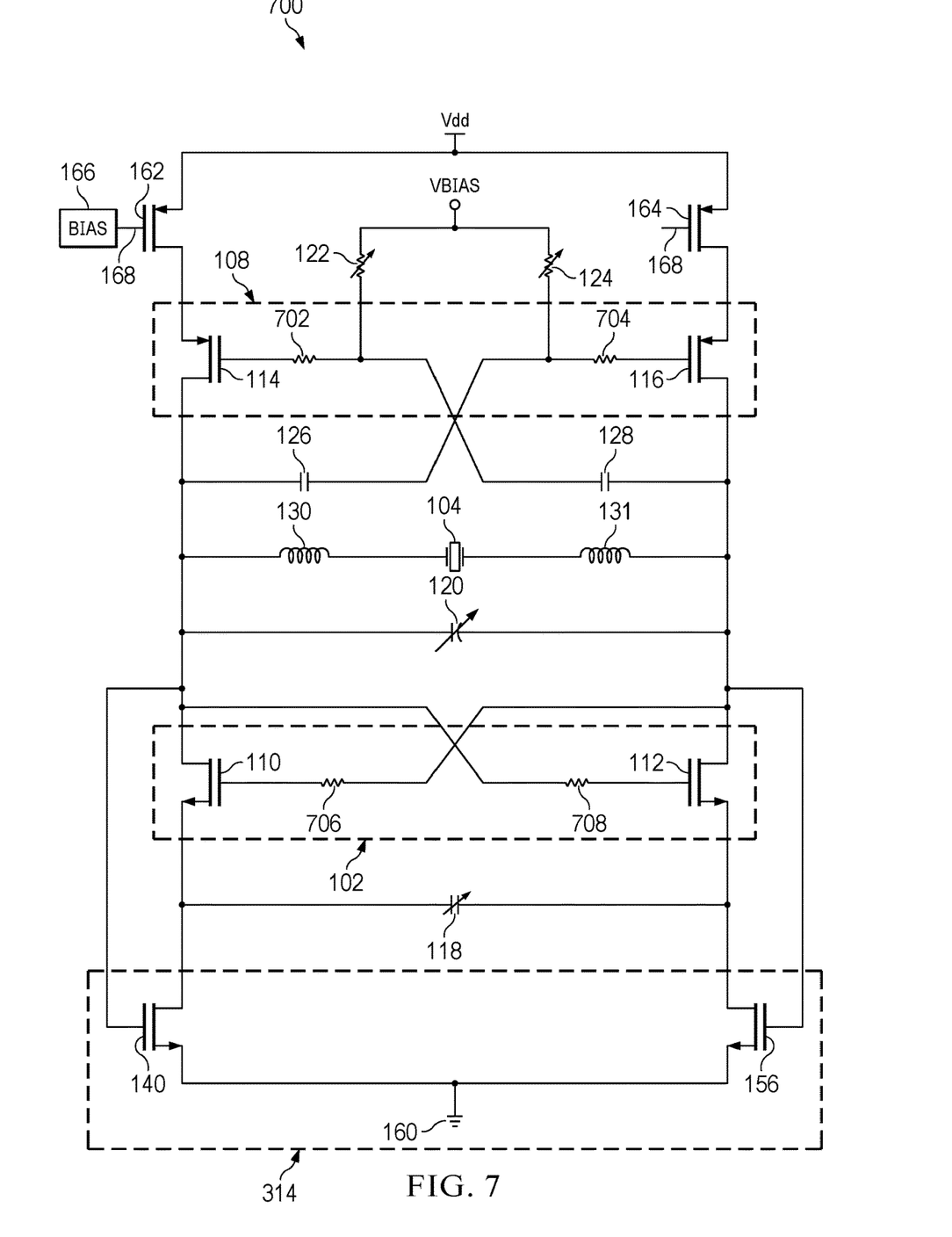
FIG. 7 is a schematic diagram of an example oscillator circuit that includes a BAW resonator and low-pass filtering to reduce high-frequency gain.

FIG. 7 is a schematic diagram of an example oscillator circuit 700. The oscillator circuit 700 is similar to the oscillator circuit 100 and/or the oscillator circuit 300. The oscillator circuit 700 includes the transistor pair 102, the resonator 104, the transistor pair 108, the capacitors 118, 120, 126, and 128, and the resistors 122 and 124. The oscillator circuit 700 includes the common-mode feedback circuit 314. In some examples of the oscillator circuit 700, the common-mode feedback circuit 106 may be used as the common-mode feedback circuit 314. Some examples of the oscillator circuit 700 may also include the current ramp circuit 316.

The oscillator circuit 700 provides additional margin at frequencies above the fundamental frequency of the resonator 104, relative to the oscillator circuit 100 and oscillator circuit 300, by reducing the small signal loop gain at high frequencies. The additional margin can increase the immunity of the oscillator circuit 700 to oscillation at high frequencies related to aging, changes in bond wire inductance, etc. The increased margin is provided by adding resistors 702, 704, 706, and 708 at the control terminals of the transistors 114, 116, 110, and 112. The resistance of the resistors 702, 704, 706, and 708 may be selected based on the capacitance of the control terminals of the transistors 114, 116, 110, and 112 to provide a desired low-pass filter that attenuates frequencies above the fundamental frequency of the resonator 104. The resistor 702 is coupled between the control terminal of the transistor 114 and the second terminal of the resonator 104. The resistor 704 is coupled between the control terminal of the transistor 116 and the first terminal of the resonator 104. The resistor 706 is coupled between the control terminal of the transistor 110 and the second terminal of the resonator 104. The resistor 708 is coupled between the control terminal of the transistor 112 and the first terminal of the resonator 104. The resistors 702, 704, 706, and 708, in conjunction with the control terminal capacitance (e.g., gate capacitance) of the transistor to which the resistor is coupled provide a low pass filter that reduces high frequency gain to prevent high frequency oscillation.

Figure 8:
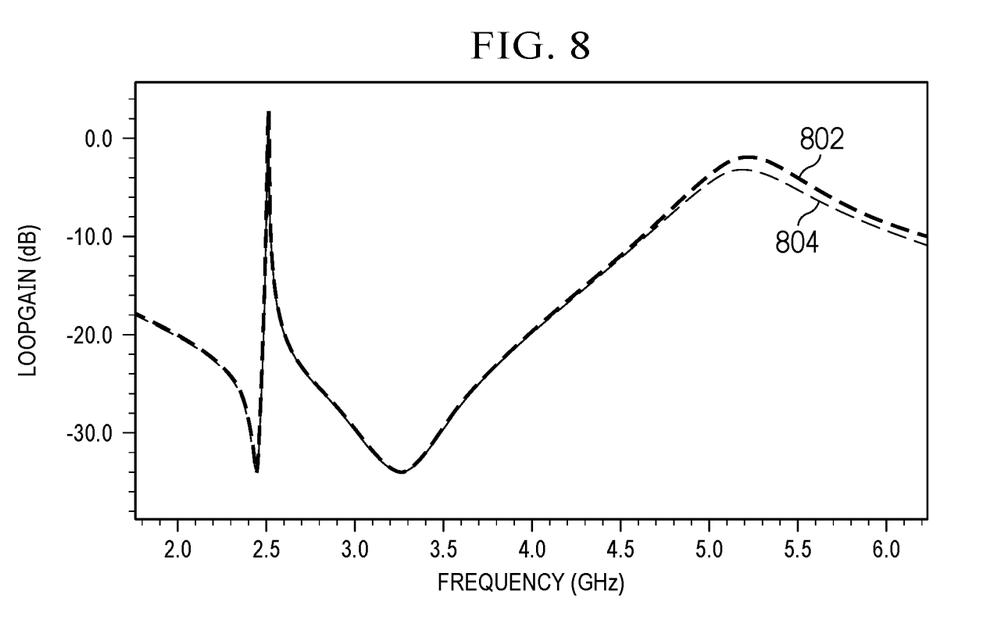
FIG. 8 is a graph showing an example of reduction in small signal gain at higher frequencies of the oscillator circuit of FIG. 7.

FIG. 8 is a graph showing example small signal loop gain in the oscillator circuit 700. FIG. 8 shows curves 802 and 804. The curve 802 represents the small signal loop gain of an oscillator without the resistors 702, 704, 706, and 708, and the curve 804 represents the small signal loop gain of the oscillator circuit 700. Comparing the curves 802 and 804, the oscillator circuit 700 reduces gain at high frequencies by about 2 dB relative to an oscillator circuit that lacks the resistors 702, 704, 706, and 708, which helps prevent oscillation at frequencies above the fundamental frequency of the resonator 104.

Figure 9:
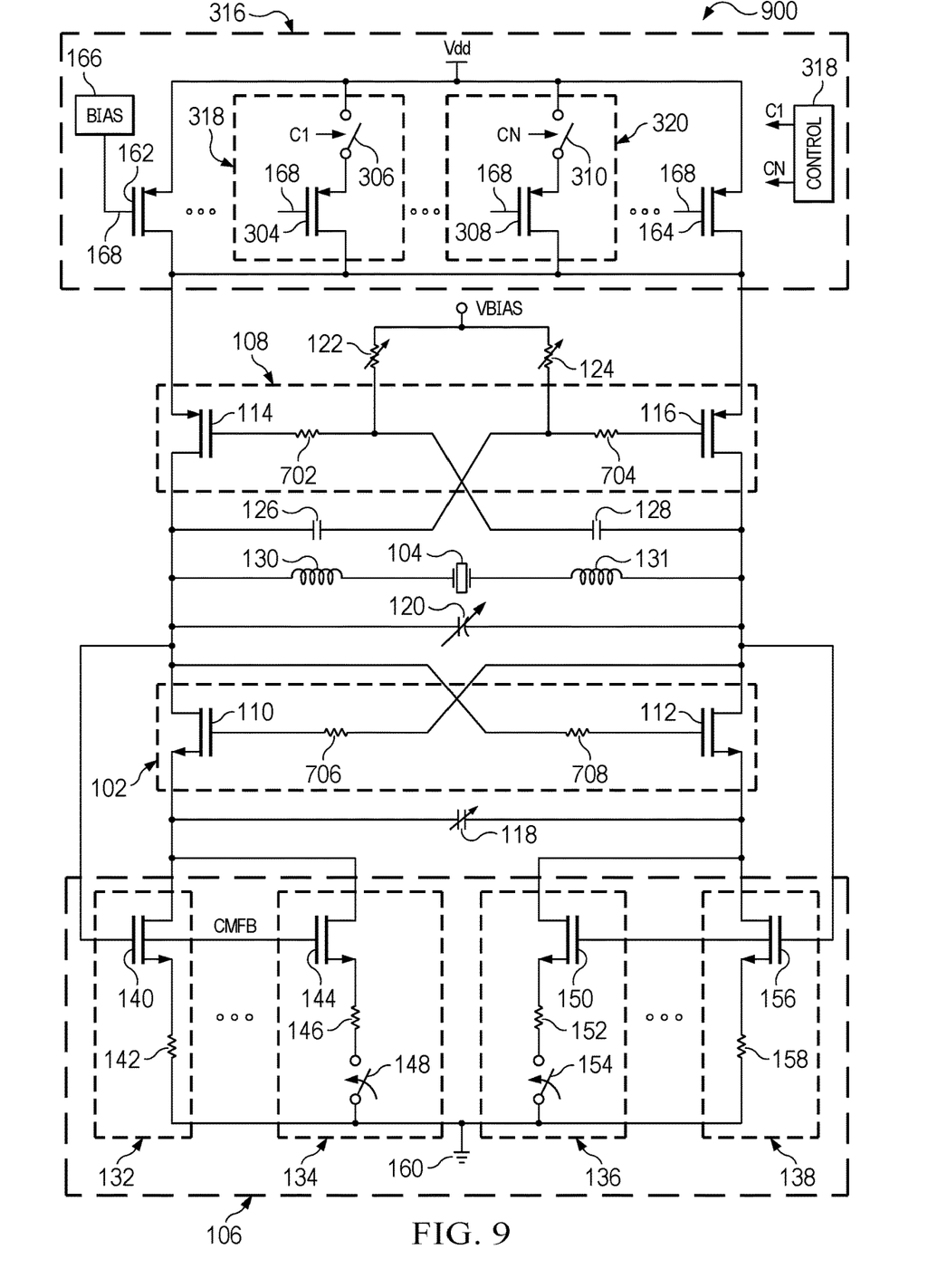
FIG. 9 is a schematic diagram of an example oscillator circuit that includes a BAW resonator, variable common-mode feedback, current ramping, and low-pass filtering.

FIG. 9 is a schematic diagram of an example oscillator circuit 900. The oscillator circuit 900 is similar to the oscillator circuit 100, the oscillator circuit 300, and the oscillator circuit 700. The oscillator circuit 900 includes the transistor pair 102, the resonator 104, the transistor pair 108, the capacitors 118, 120, 126, and 128, and the resistors 122 and 124. The oscillator circuit 900 also includes the common-mode feedback circuit 106, the current ramp circuit 316 and the resistors 702, 704, 706, and 708 described with respect to the oscillator circuit 100, the oscillator circuit 300, and the oscillator circuit 700. Accordingly, the oscillator circuit 900 provides all of the advantages of the oscillator circuits 100, 300, and 700.

Figure 10:
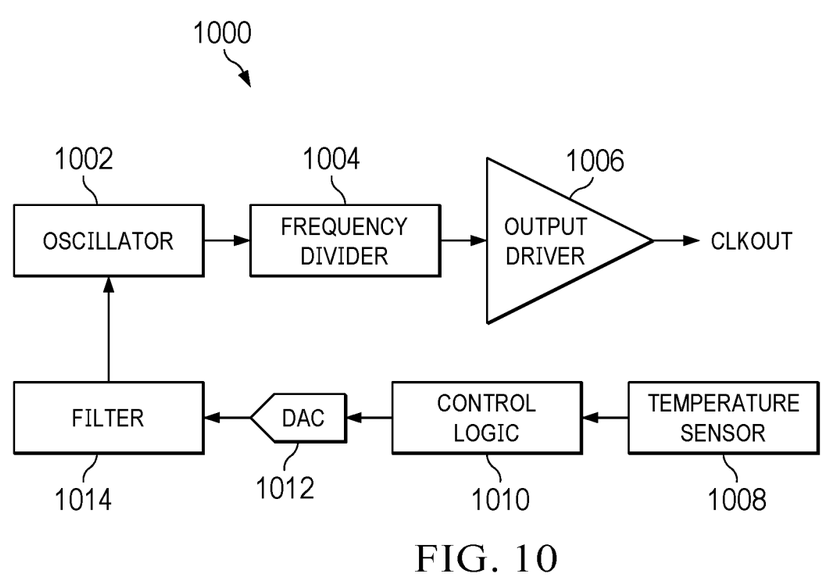
FIG. 10 is a block diagram of an example clock generator circuit that includes an oscillator circuit as described herein.

FIG. 10 is a block diagram of an example clock generator circuit 1000. The clock generator circuit 1000 includes an oscillator circuit 1002, a frequency divider circuit 1004, an output driver circuit 1006, a temperature sensor 1008, control logic 1010, a digital-to-analog converter (DAC) 1012, and a filter 1014. The oscillator circuit 1002 may be an implementation of the oscillator circuit 100, the oscillator circuit 300, the oscillator circuit 700, or the oscillator circuit 900. An output of the oscillator circuit 1002 is coupled to an input of the frequency divider circuit 1004. The frequency divider circuit 1004 includes circuitry that divides the frequency of the output signal received from the oscillator circuit 1002 by an integer or non-integer divisor to produce a desired clock frequency. An output of the frequency divider circuit 1004 is coupled to an input of the output driver circuit 1006. The output driver circuit 1006 buffers the output of the frequency divider circuit 1004 to produce an output clock signal (CLKOUT) provided to an external circuit (not shown).

The temperature sensor 1008 measures the temperature of the operating environment of the oscillator circuit 1002. The temperature sensor 1008 is coupled to the control logic 1010 and provides temperature measurements to the control logic 1010. The control logic 1010 generates an adjustment value based on temperature measurements received from the temperature sensor 1008. For example, the control logic 1010 may include a look-up table that stores adjustment values for temperatures values or temperature ranges. An output of the control logic 1010 is coupled to the DAC 1012. The control logic 1010 provides the adjustment values to the DAC 1012, and the DAC 1012 converts the adjustment values to an analog signal. An output of the DAC 1012 is coupled to the filter 1014. The filter 1014 filters (e.g., low-pass filters) the analog signal received from the DAC 1012, and provides the filtered signal to the oscillator circuit 1002. The oscillator circuit 1002 applies the filtered signal to adjust the frequency of the oscillator circuit 1002 for temperature. For example, the analog signal may be applied to adjust the capacitance of the capacitor 120 (FIG. 9), which can adjust the frequency generated by the oscillator circuit 1002.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal," "node," "interconnection," "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead with little or no change to the remaining circuitry. For example, a field effect transistor ("FET") (such as an n-channel FET (NFET) or a p-channel FET (PFET)), a bipolar junction transistor (BJT—e.g., NPN transistor or PNP transistor), an insulated gate bipolar transistor (IGBT), and/or a junction field effect transistor (JFET) may be used in place of or in conjunction with the devices described herein. The transistors may be depletion mode devices, drain-extended devices, enhancement mode devices, natural transistors, or other types of device structure transistors. Furthermore, the devices may be implemented in/over a silicon substrate (Si), a silicon carbide substrate (SiC), a gallium nitride substrate (GaN) or a gallium arsenide substrate (GaAs).

References may be made in the claims to a transistor's control input and its current terminals. In the context of a FET, the control input is the gate, and the current terminals are the drain and source. In the context of a BJT, the control input is the base, and the current terminals are the collector and emitter.

References herein to a FET being "ON" or "enabled" means that the conduction channel of the FET is present and drain current may flow through the FET. References herein to a FET being "OFF" or "disabled" means that the conduction channel is not present so drain current does not flow through the FET. An "OFF" FET, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter or, if the parameter is zero, a reasonable range of values around zero.

Modifications are possible in the described examples, and other examples are possible, within the scope of the claims.

What is claimed is:

1. A circuit comprising:
   a resonator having first and second terminals;
   a first transistor having a first terminal coupled to the first terminal of the resonator, a second terminal, and a control terminal coupled to the second terminal of the resonator;
   a second transistor having a first terminal coupled to the second terminal of the resonator, a second terminal, and a control terminal coupled to the first terminal of the resonator;
   a third transistor having a first terminal coupled to the second terminal of the first transistor, a second terminal, and a control terminal coupled to the first terminal of the resonator;
   a first resistor coupled between the second terminal of the third transistor and a reference voltage terminal;
   a first capacitor coupled between the control terminal of the first transistor and the second terminal of the resonator; and
   a second capacitor coupled between the control terminal of the second transistor and the first terminal of the resonator.

2. A circuit comprising:
   a resonator;

a transistor pair cross-coupled across the resonator; and
a common-mode feedback circuit coupled to the transistor pair, the common-mode feedback circuit including:
   a first degeneration cell and a second degeneration cell connected in parallel with the first degeneration cell, the second degeneration cell configured to switchably vary a current flow through the transistor pair.

3. The circuit of claim 2, wherein:
the first degeneration cell includes a first transistor and a first resistor coupled in series between the transistor pair and a reference voltage terminal; and
the second degeneration cell includes a second transistor, a second resistor, and a switch coupled in series between the transistor pair and the reference voltage terminal.

4. The circuit of claim 2, wherein:
the transistor pair is a first transistor pair; and
the circuit includes:
   a second transistor pair cross-coupled across the resonator; and
   a current ramp circuit coupled to the second transistor pair, the current ramp circuit configured to increase current flow in the second transistor pair as a function of time.

5. The circuit of claim 4, wherein the current ramp circuit includes:
a first transistor coupled between the second transistor pair and a power terminal;
a first ramp cell coupled in parallel with the first transistor between the second transistor pair and a power terminal, the first ramp cell including a second transistor and a first switch coupled in series between the second transistor pair and the power terminal; and
a second ramp cell coupled in parallel with the first ramp cell between the second transistor pair and the power terminal, the second ramp cell including a third transistor and a second switch coupled in series between the second transistor pair and the power terminal.

6. The circuit of claim 5, wherein the current ramp circuit includes a ramp control circuit coupled to the first switch and the second switch, the ramp control circuit configured to sequentially close the first switch and the second switch.

7. The circuit of claim 4, wherein:
the first transistor pair includes a first transistor and second transistor;
the second transistor pair includes a third transistor and a fourth transistor; and
the circuit includes:
   a first resistor coupled between a control terminal of the first transistor and a first terminal of the resonator;
   a second resistor coupled between a control terminal of the second transistor and a second terminal of the resonator;
   a third resistor coupled between a control terminal of the third transistor and a first terminal of the resonator; and
   a fourth resistor coupled between a control terminal of the fourth transistor and a second terminal of the resonator.

8. The circuit of claim 7, wherein a resistance of the first, second, third, and fourth resistors is selected to provide a low-pass filter that attenuates frequencies above a fundamental frequency of the resonator.

9. A clock generator circuit comprising:
an oscillator circuit including:
   a resonator;
   a transistor pair cross-coupled across the resonator;
   a common-mode feedback circuit coupled to the transistor pair, the common-mode feedback circuit includes:
      a first degeneration cell; and
      a second degeneration cell connected in parallel with the first degeneration cell, the second degeneration cell configured to switchably vary a current flow through the transistor pair;
a frequency divider circuit coupled to the oscillator circuit; and
a driver circuit coupled to the frequency divider circuit.

10. The clock generator circuit of claim 9, wherein:
the first degeneration cell includes a first transistor and a first resistor coupled in series between the transistor pair and a reference voltage terminal; and
the second degeneration cell includes a second transistor, a second resistor, and a switch coupled in series between the transistor pair and a reference voltage terminal.

11. The clock generator circuit of claim 9, wherein:
the transistor pair is a first transistor pair; and
the oscillator circuit includes:
   a second transistor pair cross-coupled across the resonator; and
   a current ramp circuit coupled to the second transistor pair, the current ramp circuit configured to increase current flow in the second transistor pair as a function of time.

12. The clock generator circuit of claim 11, wherein the current ramp circuit includes:
a first transistor coupled between the second transistor pair and a power terminal;
a first ramp cell coupled in parallel with the first transistor between the second transistor pair and a power terminal, the first ramp cell including a second transistor and a first switch coupled in series between the second transistor pair and a power terminal;
a second ramp cell coupled in parallel with the first ramp cell between the second transistor pair and the power terminal, the second ramp cell including a third transistor and a second switch coupled in series between the second transistor pair and the power terminal; and
a ramp control circuit coupled to the first switch and the second switch, the ramp control circuit configured to sequentially close the first switch and the second switch.

13. The clock generator circuit of claim 11, wherein:
the first transistor pair includes a first transistor and second transistor;
the second transistor pair includes a third transistor and a fourth transistor; and
the oscillator circuit includes:
   a first resistor coupled between a control terminal of the first transistor and a first terminal of the resonator;
   a second resistor coupled between a control terminal of the second transistor and a second terminal of the resonator;
   a third resistor coupled between a control terminal of the third transistor and a first terminal of the resonator; and
   a fourth resistor coupled between a control terminal of the fourth transistor and a second terminal of the resonator;
   wherein a resistance of the first, second, third, and fourth resistors is selected to provide a low-pass filter that attenuates frequencies above a fundamental frequency of the resonator.

* * * * *